United States Patent
Wu et al.

(10) Patent No.: US 7,429,517 B2
(45) Date of Patent: Sep. 30, 2008

(54) CMOS TRANSISTOR USING HIGH STRESS LINER LAYER

(75) Inventors: Zhiqiang Wu, Plano, TX (US); Haowen Bu, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 256 days.

(21) Appl. No.: 10/845,456

(22) Filed: May 13, 2004

(65) Prior Publication Data
US 2005/0255659 A1    Nov. 17, 2005

(51) Int. Cl.
H01L 21/336    (2006.01)
(52) U.S. Cl. .............. 438/299; 438/301; 438/303; 438/791
(58) Field of Classification Search .......... 438/299, 438/301, 303, 791
See application file for complete search history.

(56) References Cited

U.S. PATENT DOCUMENTS 6,287,951 B1 * 9/2001 Lucas et al. ............. 438/618
2003/0181005 A1 * 9/2003 Hachimine et al. ......... 438/231
2004/0104405 A1 * 6/2004 Huang et al. ............. 257/199
2005/0048753 A1 * 3/2005 Schwan .................. 438/595

OTHER PUBLICATIONS

Wolf et al. "Silicon Processing for the VLSI ERA", 1986, vol. 1, pp. 191-194.*

* cited by examiner

*Primary Examiner*—Thanh Nguyen
(74) *Attorney, Agent, or Firm*—Wade J. Brady, III; Frederick J. Telecky, Jr.

(57) ABSTRACT

A MOS transistor structure comprising a gate dielectric layer (30), a gate electrode (40), and source and drain regions (70) are formed in a semiconductor substrate (10). First second and third dielectric layers (110), (120), and (130) are formed over the MOS transistor structure. The second and third dielectric structures (120), (130) are removed leaving a MOS transistor with a stressed channel region resulting in improved channel mobility characteristics.

23 Claims, 2 Drawing Sheets

CMOS TRANSISTOR USING HIGH STRESS LINER LAYER

FIELD OF THE INVENTION

This invention relates generally to the field of integrated circuit manufacturing and more particularly to a method for forming high performance MOS transistors.

BACKGROUND OF THE INVENTION

The performance of an integrated circuit metal oxide semiconductor (MOS) transistor depends on a number of device parameters such as gate dielectric thickness, transistor gate length, and the mobility of the electrons and/or holes in the MOS transistor channel region. The mobility of the electrons and/or holes (herein after referred to as carriers) is a measurement of how quickly the carriers traverse the transistor channel region. In general, the mobility of the carriers in the transistor channel region is related to the velocity of the carriers and the channel electric field by $\mu = V_{carriers}/E_{channel}$, where $\mu$ is the carrier mobility, $V_{carriers}$ is velocity of the carriers in the channel, and $E_{channel}$ is the electric field in the MOS transistor channel. In general, the carrier mobility is affected by a number of factors including the scattering of the carriers as they traverse the transistor channel region from the transistor source region to the transistor drain region.

An important measure of MOS transistor performance is the magnitude of the transistor drain current ($I_{DS}$) obtained for a given gate-source voltage ($V_{GS}$) and a given drain-source voltage ($V_{DS}$). In addition to being dependent on $V_{GS}$ and $V_{DS}$, $I_{DS}$ is proportional to the carrier mobility $\mu$. It is therefore important that the carrier mobility $\mu$ be maximized for improving transistor performance. Recently, it has been found that the application of stress in the transistor channel region is an important factor in increasing the value of the carrier mobility $\mu$. A number of methods have been utilized to apply stress to the transistor channel region including the formation of a high stress film over the transistor structure. It has been found that the applied stress is a function of the thickness of the film, with the applied stress increasing with film thickness. The high density of integrated circuits limits the thickness of the films that can be used. There is therefore a need for a method to increase the stress produced in the transistor channel by high stress films without increasing the film thickness. The instant invention addresses this need.

SUMMARY OF THE INVENTION

A method for forming improved MOS transistors is described. The method comprises forming a gate dielectric layer on a surface of a semiconductor surface. A gate electrode is formed on the gate dielectric layer, and source and drain regions are formed in the semiconductor adjacent to the gate electrode structure. A plurality of dielectric layers are formed over the gate electrode and said source and drain regions and a subset of the plurality of dielectric layers are removed, leaving at least one of the plurality of dielectric layers remaining over the gate electrode and source and drain regions. An optional thermal anneal can be performed following the removal of the subset of the dielectric layers. A second dielectric layer is formed over the at least one of the plurality of dielectric layers remaining over the gate electrode and source and drain regions, and contact structures are formed to the source and drain regions through the second dielectric layer.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which.

DETAILED DESCRIPTION OF THE INVENTION

Figure 1A:
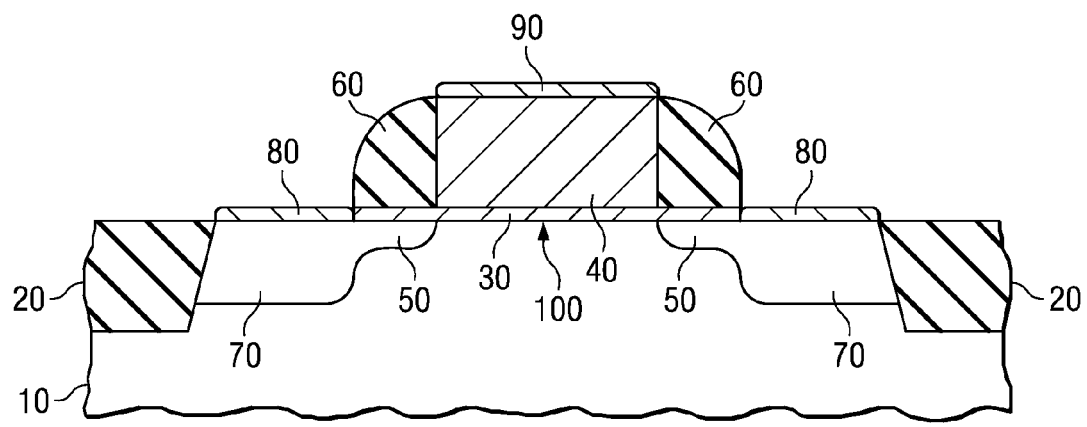
FIG. 1(a)-FIG. 1(d) are cross-sectional diagrams showing an embodiment of the instant invention.

Shown in FIGS. 1(a) to FIG. 1(d) are cross-sectional diagrams of a first embodiment of the instant invention. Illustrated in FIG. 1(a) is a MOS transistor formed using known integrated circuit manufacturing methods. Isolation regions 20 are formed in a semiconductor substrate 10. The isolation regions 20 are formed using suitable dielectric materials such as silicon oxide. The isolation regions 20 can comprise shallow trench isolation (STI) structures, local oxidation structures (LOCOS), or a combination of these and/or other suitable structures. A transistor gate stack comprising a gate dielectric layer 30 and a gate electrode 40 is formed on the surface of the semiconductor 10. The gate electrode 40 usually comprises a conductive material such as doped polycrystalline silicon, various metals and/or metal silicides. The gate dielectric layer 30 can comprise any suitable dielectric material such as silicon oxide, silicon nitride, silicon oxynitride, high k dielectric materials such as hafnium, and other suitable material. In this disclosure high k means dielectric material with a dielectric constant greater than 3.9. Typical thicknesses for the transistor gate stack are between 800 A and 5000 A. Following the formation of the transistor gate stack a number of self-aligned implants are performed. These self-aligned implants include drain/source extension implants and pocket implants. The self-aligned implants that are aligned to the transistor gate stack will result in the formation of the doped drain extension regions 50 in the semiconductor substrate 10. Sidewall structures 60 are formed adjacent to the gate electrode 40 using standard processing technology. The sidewall structures 60 typically comprise dielectric material such as silicon oxide, silicon nitride, or any other suitable dielectric material. Following the formation of the sidewall structures 60, the transistor source and drain regions 70 are formed by implanting suitable dopants into the semiconductor substrate 10. Following the formation of the source and drain regions 70, metal silicide layers 80 and 90 are formed on the source and drain regions 70 and the gate electrode 40 respectively. In an embodiment, the metal silicide regions 80, 90 comprise nickel silicide, cobalt silicide, or any other suitable metal silicide material. In the case where the gate electrode 40 comprises a metal or a metal silicide, no silicide layer 90 will be formed on the gate electrode. As shown in FIG. 1(a), the channel region 100 of the MOS transistor structure is defined in this disclosure as that region of the substrate 10 beneath the gate electrode 40 to which the inversion layer is confined. The inversion layer is formed in a NMOS transistor when a voltage is applied to the gate electrode that exceeds a voltage applied to the transistor source region 70 by an amount equal to or greater than the transistor threshold voltage. For a NMOS transistor the inversion layer comprises electrons. In a similar manner, the inversion layer is formed in a PMOS transistor when a voltage is applied to the transistor source region 70 that exceeds a voltage applied to the gate electrode 40 by an amount equal to or greater than the transistor threshold voltage. For a PMOS transistor the inversion layer comprises holes.

Figure 1B:
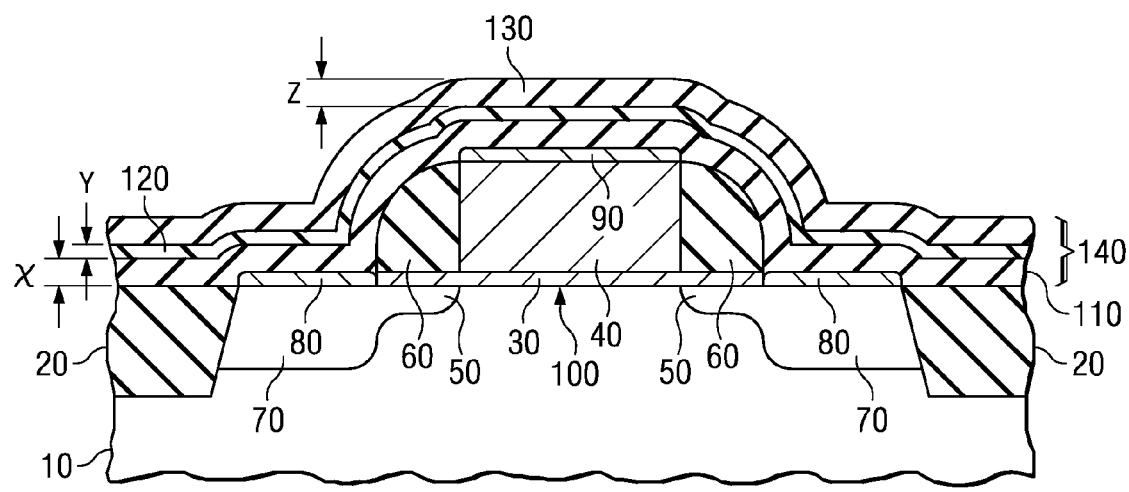

Following the formation of the MOS transistor structure shown in FIG. 1(a), dielectric stack 140 is formed over the transistor structure as shown in FIG. 1(b). In general, the dielectric stack 140 comprises a plurality of layers formed using different dielectric materials. For example the dielectric stack 140 can comprise two layers where first layer comprises a different dielectric material than that used to form the second dielectric layer. If more than two different dielectric layers are used to form the dielectric stack, two or more of the layers used to comprise the stack 140 can be formed using the same dielectric material. Any suitable dielectric material such as silicon nitride, silicon oxide, silicon oxynitride, silicon carbide, silicon oxycarbide (SiOC), etc. can be used to form one or more of the layers that comprise the dielectric stack 140. In an embodiment of the instant invention, the stack 140 comprises a first silicon nitride layer 110, a silicon oxide layer 120, and a second silicon nitride layer 130. Layer 110 and 130 are high stress layers and are used to strain the underlying transistors. The layer 120 is used as an etch stop. The layers 110, 120, and 130 can be formed using any suitable method. In an embodiment, the first silicon nitride layer 110 is formed using a plasma enhanced chemical vapor deposition (PECVD) process at temperatures between 300° C. to 500° C. using silane ($SiH_4$) and ammonia ($NH_3$) at flow rates of 50 sccm to 150 sccm and 1000 sccm to 3000 sccm respectively. The pressure during the first silicon nitride deposition process can be set at 3.5 torr or higher. The high frequency RF power is set at about 50 Watts at 13.56 MHz and low frequency power set at about 10-20 Watts at 350 KHz. The thickness of the dielectric layer is related to the density of the transistors on the integrated circuit and in particular to the distance between two closest neighboring transistors. In an embodiment, the thickness x of the first silicon nitride layer 110 is between 100 A and 500 A and more preferably between 200 A and 400 A. The silicon oxide layer 120 is formed using a plasma enhanced chemical vapor deposition (PECVD) process at temperatures between 300° C. to 500° C. using silane ($SiH_4$) and nitrous oxide ($N_2O$) at flow rates of 50 sccm to 150 sccm and 1000 sccm to 3000 sccm respectively. The pressure during the silicon oxide layer 120 deposition can be set between 1 torr to 5 torr. The thickness y of the silicon oxide layer 120 is between 20 A and 500 A. The second silicon nitride layer 130 is formed using a plasma enhanced chemical vapor deposition (PECVD) process at temperatures between 300° C. to 500° C. using silane ($SiH_4$) and ammonia ($NH_3$) at flow rates of 50 sccm to 150 sccm and 1000 sccm to 3000 sccm respectively. The pressure during the first silicon nitride deposition process can be set at 3.5 torr or higher. The high frequency RF power is set at about 50 Watts at 13.56 MHz and low frequency power set at about 10-20 Watts at 350 KHz. The thickness z of the second silicon nitride layer 130 is between 200 A and 100 A.

Using the above stated process conditions, the dielectric stack layer 140 exerts a tensile stress in the channel region 100. As described above, a tensile stress in the channel region 100 will serve to enhance the mobility of the electrons comprising the inversion layer in an NMOS transistor. Similarly, layer 110 and 130 in the dielectric stack 140 can be deposited under different process conditions, for example, the high frequency RF power is decreased to 30 Watts or lower, the low frequency RF power is increased to 25 Watts or higher, and the pressure is decreased to 3 torr or lower. Under these process conditions, the dielectric layer 140 can exert a compressive stress in the channel region. The mobility of holes that comprise the inversion layer in a PMOS transistor can be enhanced by compressive exerted in the channel region 100. Following the formation of the dielectric stack, an optional thermal anneal can be performed to further increase the stress exerted on the structure. In the case where the underlying silicide regions 80 are formed using nickel silicide, the optional anneal is performed at temperatures between 300° C. and 500° C. For the case where the underlying silicide regions 90 are formed using cobalt silicide, the option anneal is performed at temperatures between 300° C. and 800° C.

Figure 1C:
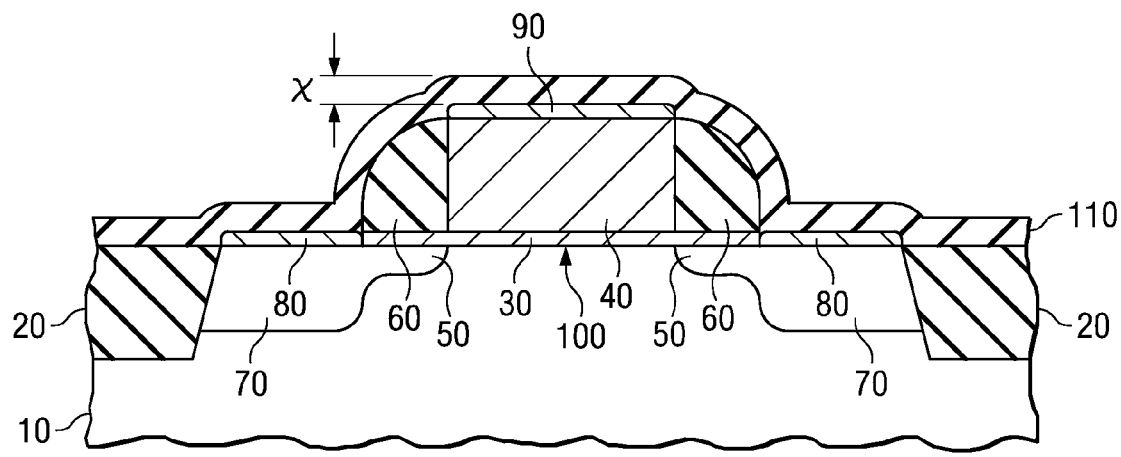

Following the formation of the dielectric stack 140, and any optional thermal anneals, the second dielectric layer 130 and the silicon oxide layer 120 are removed as shown in FIG. 1(c). Although any suitable method can be used to remove the layers 130 and 120, in an embodiment, phosphoric acid is used to remove the second nitride layer 130, and diluted hydrofluoric acid is used to remove the silicon oxide layer 120. The remaining silicon nitride layer 110 will exert a stress in the channel region 100 that is greater than the stress that would be exerted by a similar layer silicon nitride that did not receive the above described processing steps. In this way, the stress exerted in the channel region 100 is increased without increasing the thickness of the remaining tensile stress layer. The method of the instant invention therefore offers significant advantages over existing methods for forming tensile stress layers.

Figure 1D:
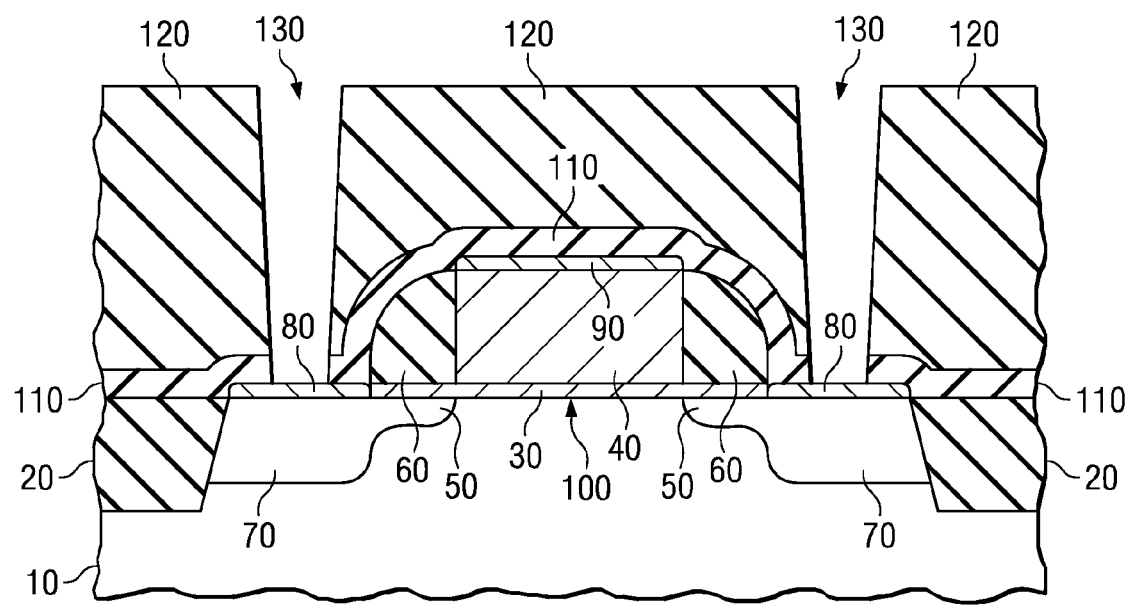

As shown in FIG. 1(d), metal contacts 130 can be formed to the source and drain regions 70 of the MOS transistor structure shown in FIG. 1(c). Following the removal of the layers 130 and 120, a dielectric layer 120 can be formed over the structure as shown in FIG. 1(d). Standard photolithograpy can be used to etch contact holes to the silicide regions 80 overlying the source and drain regions 70. Metal 70 is then used to fill the contact holes to form contact structures 130 to the MOS transistor source and drain regions 70.

The embodiment of the instant invention illustrated in FIG. 1(a) through FIG. 1(d) applies equally well to both NMOS and PMOS transistors. Whether a transistor is NMOS or PMOS will depend on the conductivity type of the substrate 10, doped extension regions 50, and the source and drain regions 70.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. A method for forming MOS transistors, comprising:
   providing a semiconductor substrate;
   forming a first dielectric layer on a surface of the semiconductor substrate;
   forming a gate electrode on said dielectric layer;
   forming source and drain regions in said semiconductor substrate adjacent said gate electrode;
   forming a plurality of dielectric layers over said semiconductor substrate, said gate electrode and said source and drain regions, the plurality of layers comprising a second dielectric layer and a third dielectric layer, wherein each of the second and third layers exert a compressive stress on the semiconductor substrate, or each of the second and third layers exert a tensile stress on the semiconductor substrate;
   removing the entire third layer formed over the semiconductor substrate, while leaving at least the second layer remaining over said gate electrode and said source and drain regions;

forming a fourth dielectric layer over said at least second layer remaining over said gate electrode and said source and drain regions; and forming contact structures to said source and drain regions through said fourth dielectric layer.

2. The method of claim 1 further comprising annealing said plurality of dielectric layers prior to completely removing the subset of said plurality of dielectric layers.

3. The method of claim 1 further comprising annealing said at least second layer remaining over said gate electrode and said source and drain regions prior to forming said fourth dielectric layer.

4. The method of claim 1 wherein said second dielectric layer is a silicon nitride layer, and further wherein forming a plurality of dielectric layers over said gate electrode and said source and drain regions comprises forming a silicon oxide layer between the second and third layers.

5. The method of claim 4 wherein the third dielectric layer is a silicon nitride layer.

6. The method of claim 1 wherein the second and third dielectric layers are both formed under conditions that result in a compressive stress on the semiconductor substrate.

7. The method of claim 1 wherein the second and third dielectric layers are both formed under conditions that result in a tensile stress on the semiconductor substrate.

8. A method for forming enhanced MOS transistors, comprising:

providing a semiconductor substrate;

forming a first dielectric layer on a surface of the semiconductor;

forming a gate electrode on said dielectric layer;

forming source and drain regions in said semiconductor substrate adjacent said gate electrode;

forming a second dielectric layer over said gate electrode and said source and drain regions;

forming a third dielectric layer over said second dielectric layer;

forming a fourth dielectric layer over said third dielectric layer;

removing said third dielectric layer and said fourth dielectric layer;

forming a fifth dielectric layer over said second dielectric layer; and forming contact structures to said source and drain regions through said second dielectric layer, wherein the second and fourth dielectric layers are either both formed under conditions that result in a compressive stress on the semiconductor substrate, or both formed under conditions that result in a tensile stress on the semiconductor substrate;

and further comprising annealing said second dielectric layer after forming said fourth dielectric layer and prior to removing said fourth dielectric layer from over said second dielectric layer.

9. The method of claim 8 further comprising annealing said second dielectric layer prior to forming said fifth dielectric layer.

10. The method of claim 8 further comprising annealing said second dielectric layer prior to removing said third dielectric layer and said fourth dielectric layer.

11. The method of claim 8 wherein said second dielectric layer comprises silicon nitride.

12. The method of claim 11 wherein said third dielectric layer comprises silicon oxide.

13. The method of claim 12 wherein said fourth dielectric layer comprises silicon nitride.

14. The method of claim 8, wherein the second and fourth dielectric layers are both formed under conditions that result in a compressive stress on the semiconductor substrate.

15. The method of claim 8, wherein the second and fourth dielectric layers are both formed under conditions that result in a tensile stress on the semiconductor substrate.

16. A method for forming stressed MOS transistors, comprising:

providing a semiconductor substrate;

forming a first dielectric layer on a surface of the semiconductor substrate;

forming a gate electrode on said dielectric layer;

forming source and drain regions in said semiconductor substrate adjacent said gate electrode;

forming a first silicon nitride layer over said gate electrode and said source and drain regions;

forming a silicon oxide layer over said silicon nitride layer;

forming a second silicon nitride layer over said silicon oxide layer; and removing said entire second silicon nitride layer and said silicon oxide layer, wherein each of the first and second silicon nitride layers exert a compressive stress on the semiconductor substrate, or each of the first and second silicon nitride layers exert a tensile stress on the semiconductor substrate.

17. The method of claim 16 further comprising annealing said first silicon nitride layer following the removing of said second silicon nitride layer and said silicon oxide layer.

18. The method of claim 17 further comprising forming a second dielectric layer over said first silicon nitride layer, and forming contact structures to said source and drain regions through said second dielectric layer.

19. The method of claim 17 wherein said first silicon nitride layer is formed using a PECVD process.

20. The method of claim 19 wherein said first silicon nitride layer is formed to a thickness between 100 A and 500 A.

21. The method of claim 20 wherein said annealing of said first silicon nitride layer is performed at temperatures between 300° C. and 800° C.

22. The method of claim 16, wherein the first and second silicon nitride layers are both formed under conditions that result in a tensile stress on the semiconductor substrate.

23. A method for forming stressed MOS transistors, comprising:

providing a semiconductor substrate;

forming a first dielectric layer on a surface of the semiconductor substrate;

forming a gate electrode on said dielectric layer;

forming source and drain regions in said semiconductor substrate adjacent said gate electrode;

forming a first silicon nitride layer over said gate electrode and said source and drain regions;

forming a silicon oxide layer over said silicon nitride layer;

forming a second silicon nitride layer over said silicon oxide layer; and completely removing said second silicon nitride layer and said silicon oxide layer, wherein each of the first and second silicon nitride layers exert a compressive stress on the semiconductor substrate.

* * * * *